Dec. 6, 1966

W. H. AYER 3,290,557

WIRING DEVICE WITH SELECTIVELY SEVERABLE CONDUCTOR FOR FORMING PREDETERMINED CIRCUIT PATTERN

Filed Feb. 23, 1962

7 Sheets-Sheet 1

INVENTOR
WILLIAM H. AYER
BY
Nolte & Nolte
ATTORNEYS

Dec. 6, 1966

W. H. AYER 3,290,557

WIRING DEVICE WITH SELECTIVELY SEVERABLE CONDUCTOR FOR FORMING PREDETERMINED CIRCUIT PATTERN

Filed Feb. 23, 1962

7 Sheets-Sheet 2

INVENTOR
WILLIAM H. AYER

BY

Nolte & Nolte
ATTORNEYS

FIG. 16.
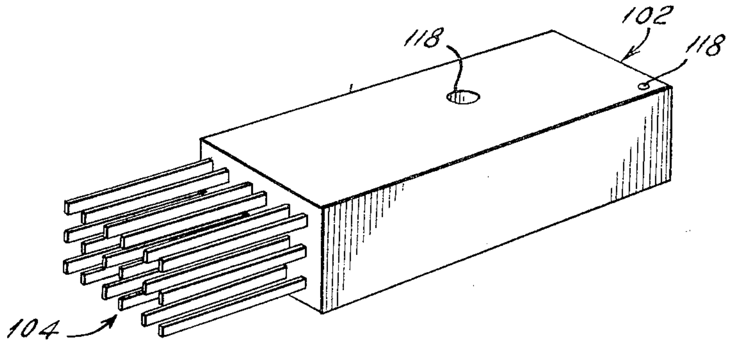
FIG. 17.
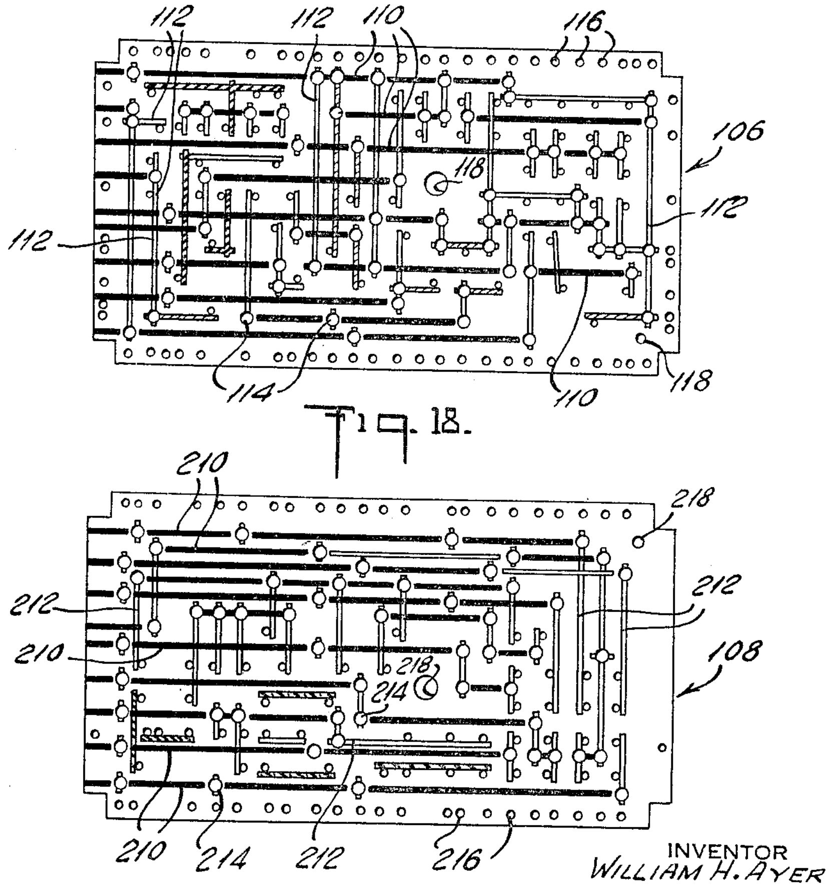
FIG. 17. FIG. 18.
INVENTOR
WILLIAM H. AYER
BY
Nolte & Nolte
ATTORNEYS INVENTOR
WILLIAM H. AYER
BY
Nolte, & Nolte
ATTORNEYS Dec. 6, 1966

W. H. AYER 3,290,557

WIRING DEVICE WITH SELECTIVELY SEVERABLE
CONDUCTOR FOR FORMING PREDETERMINED
CIRCUIT PATTERN

Filed Feb. 23, 1962

7 Sheets-Sheet 5

INVENTOR
WILLIAM H. AYER

BY

Nolte, & Nolte
ATTORNEYS

Dec. 6, 1966

W. H. AYER 3,290,557

WIRING DEVICE WITH SELECTIVELY SEVERABLE CONDUCTOR FOR FORMING PREDETERMINED CIRCUIT PATTERN

Filed Feb. 23, 1962

7 Sheets-Sheet 6

INVENTOR
WILLIAM H. AYER

BY

Nolte, & Nolte
ATTORNEYS

INVENTOR
WILLIAM H. AYER
BY
Nolte, & Nolte
ATTORNEYS

United States Patent Office 3,290,557

Patented Dec. 6, 1966

3,290,557

WIRING DEVICE WITH SELECTIVELY SEVERABLE CONDUCTOR FOR FORMING PREDETERMINED CIRCUIT PATTERN

William H. Ayer, Scituate, Mass., assignor, by direct and mesne assignments, of one-half to The Sippican Corporation, Mattapoisett, Mass., a corporation of Massachusetts, and one-half to Albert C. Nolte, Jr., New York, N.Y.

Filed Feb. 23, 1962, Ser. No. 175,200
8 Claims. (Cl. 317—101)

This application is a continuation-in-part of applicant's prior co-pending application Serial Number 857,056, filed December 3, 1959, now abandoned.

This invention relates to the interconnection of electrical equipment and to an improved method for accomplishing the same. More particularly, it concerns the prewiring of an electronic module so that a single prewired module may be stocked as a replacement part for many different types of modules designed to perform different functions.

The invention is particularly adaptable to components used in computers and other electronic systems where several basic circuits are repeated many times. Frequently, these basic circuits differ only in minor wiring aspects. Due to the high cost of modern electronic equipment, it is mandatory that repairs be accomplished promptly to maintain adequate machine utilization, and to this end it has been customary to stock a large quantity of replacement modules or basic circuit elements. It is readily apparent that frequently a big inventory of spares, involving a large expenditure, is required to maintain efficient equipment utilization.

In one form, the components of a universal replacement unit are inter-connected with a wiring matrix according to the invention. The matrix is in a general mesh or grid pattern and contains either an excess or deficiency of electrical connections between the various associated electrical components. When a malfunction occurs, and is isolated to a specific unit, a replacement unit incorporating the novel universal wiring matrix is changed into the specific spare required, by modifying the matrix wiring pattern. This can easily be accomplished either by the connection of the required intersections of the matrix or by the breaking of the unnecessary ones therein, according to a preselected pattern which if desired, may be marked directly upon an exterior surface of the unit.

The invention provides a wiring board wherein these principles may be easily and efficiently applied. One form allows the removal of the excess welded connections by a simple drilling operation, while another provides a loop portion which may be severed. In many instances, it has been found that the inherent reliability of a breaking or cutting process is preferable to a connecting process, because the latter may introduce electrical continuity problems which can be better controlled at the manufacturing level rather than at the field maintenance level.

It has been found that the principles of the invention are equally applicable to circuit boards containing a multiplicity of conductor intersections which are electrically unconnected. The circuit modification can then be accomplished by the simple connection of the required intersections to form the specific matrix and associated electronic module required. This latter technique of "making" rather than "breaking" connections has been found to be useful especially in research and development work in designing experimental computer logic circuits.

It is, therefore, an object of the invention to provide a universal wiring matrix in association with an electronic module, said matrix being easily changeable to alter the module function.

Another object of the invention is to provide a printed circuit board which contains a multiplicity of conductor intersections and connections which may be easily severable.

A still further object of the invention is to provide a circuit board containing conductor intersections which are readily connected in a desired fashion to form a specific wiring pattern.

A still further object of the invention is to provide a method by which a basic electrical assembly may be easily altered into a specific electrical assembly according to the required replacement part needed.

Still another object of the invention is to provide a universal wiring board which is simple in design, rugged in construction and economical to manufacture.

A still further object of the invention is to provide a circuit module which is entirely enclosed except for its external connecting parts and therefore, resistant to ambient temperature and humidity conditions.

Yet another object of the invention is to provide a means for the cooling of heat-generating components incorporated in the embodiments of the invention.

Other objects and advantages of the invention will become apparent and the invention will be fully understood from the following description and drawings, wherein:

FIG. 16 is a perspective view of an encapsulated module of one embodiment;

FIGS. 17 and 18 show the preprinted matrices before wiring, for the top and bottom of the module shown in FIG. 16;

Figure 1:
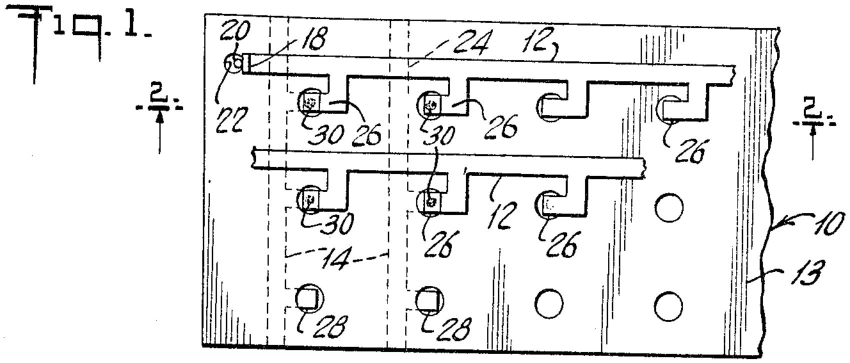
FIG. 1 is a partial top plan view of one form of the invention showing a multiplicity of connections between crossed conductors.
Figure 2:
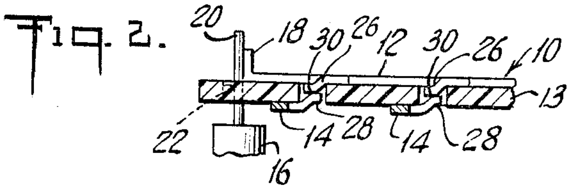
FIG. 2 is a partial cross-sectional view in elevation taken along line 2—2 of FIG. 1.
Figure 3:
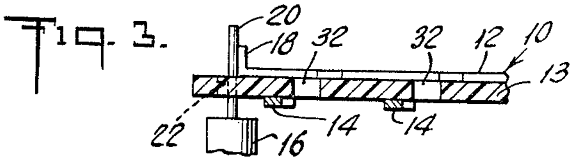
FIG. 3 is a partial cross-sectional view similar to FIG. 2 showing the severance of certain connections.
Figure 7:
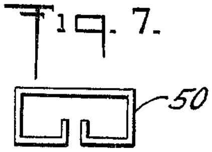
FIG. 7 is a top plan view of a conductor connection clip.
Figure 8:
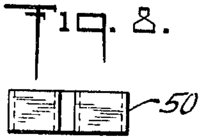
FIG. 8 is a side elevation view of the connection clip shown in FIG. 7.

Referring now to FIGS. 1–3, a broken section of the circuit board 10 is shown, having upper and lower spaced conductors 12 and 14, respectively, separated by an insulating sheet 13. The circuit board 10 is just a representative portion of an over-all circuit board and for purposes of simplicity only a single component 16 is shown connected thereto. A portion 18, forming a tab on the end of an upper conductor 12 is provided to electrically connect the conductor to the component lead 20 which extends through an aperture 22.

It will be seen that the upper and lower conductors, 12 and 14, respectively, are not interconnected at their points of intersection, such as at 24, but that the upper conductor 12 is provided with a connecting tab 26, which is in alignment with a lower-conductor-connecting tab 28 at spaced apertures within the insulating sheet 13. Electrical connection is made between these upper and lower conductor tabs 26 and 28, respectively, by welds 30. By providing such an interconnection between the upper and lower crossing conductors at a point removed from their primary points of intersection, it is thereby possible to subsequently sever the connections by a simple operation, such as drilling at the location of interconnecting welds 30. In FIG. 3, the welded portions 30 of FIG. 2 are shown to be removed by a drilling operation to form the electrically unconnected apertures 32.

In effect, the broken away portion of the circuit shown in FIG. 1, represents a shorted, criss-cross pattern of conductors which is easily adapted to a specific wiring pattern by the selective drilling of holes, as at 32, to form a specific electrical circuit. With this type of universal matrix attached to an electronic module, containing a multiplicity of components such as 16, it would be an easy task to convert a standard replacement module into a specific wiring configuration of a special unit required for a given purpose, by selective severance of the welds 30.

Figure 4:
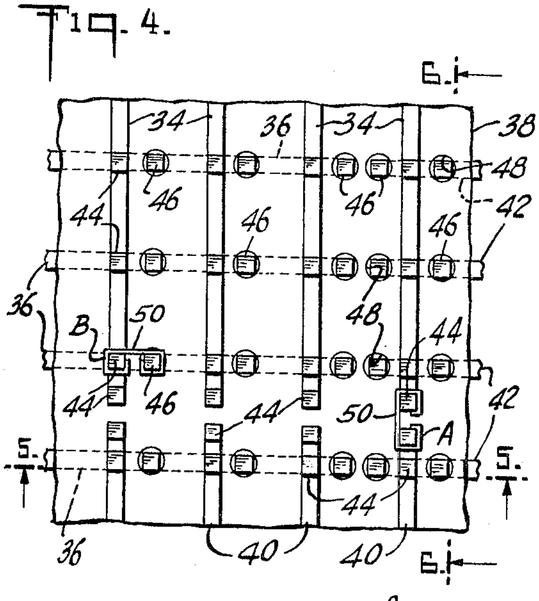
FIG. 4 is a top plan view of a circuit board showing another form of the invention.
Figure 6:
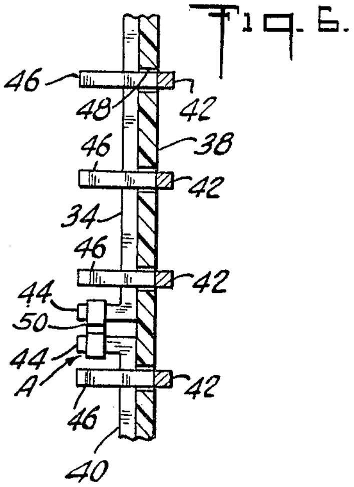
FIG. 6 is a side elevation view in cross-section taken along line 6—6 of FIG. 4.
Figure 5:
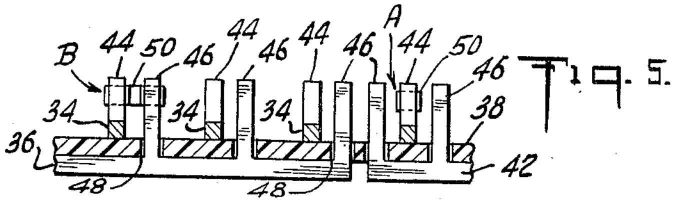
FIG. 5 is a cross-sectional view taken along line 5—5 of FIG. 4.

In the embodiment shown in FIGS. 4–8, the spaced upper conductors 34 and the lower conductors 36 are shown in checkerboard fashion and are separated by an insulating layer 38. Conductor extensions 40 are in alignment with but spaced from upper conductors 34. Similarly, the lower conductors 36 have spaced extension portions 42. Both the upper and lower conductors 34 and 36, respectively, and extensions 40 and 42, respectively, are provided with upstanding conductor tab portions or leads, respectively numbered 44 and 46. The lower connecting tabs 46 project through apertures 48 in the insulating sheet 38 and are in uniform spaced proximity to the connecting tab portions 44. In this arrangement of the invention, the universal matrix configuration is of an open circuited criss-cross mesh pattern and employs the use of a connection establishing member, such as connecting clip 50, to make the desired electrical connection between the crossing conductors. As shown in FIG. 4, a connecting clip 50 has been placed between upstanding tab portions 44, 44, at A, thereby joining upper conductor 34 to upper conductor 40. In like manner, clips could be used at selected crossover points to join either upstanding connecting tab portions on the same side of the board to one another, or to connect a lower upstanding tab portion 46 to an associated upper upstanding tab portion 44, as shown for example at B. Clips of a design other than shown, or other means, e.g. conductive plugs, etc., can also be used to establish the above-described connections.

Figure 9:
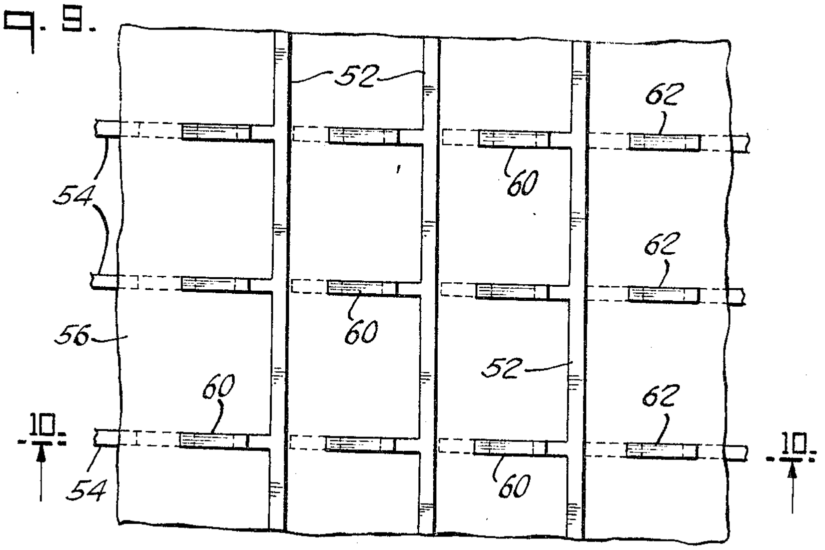
FIG. 9 is a top plan view of another form of the invention.
Figure 10:
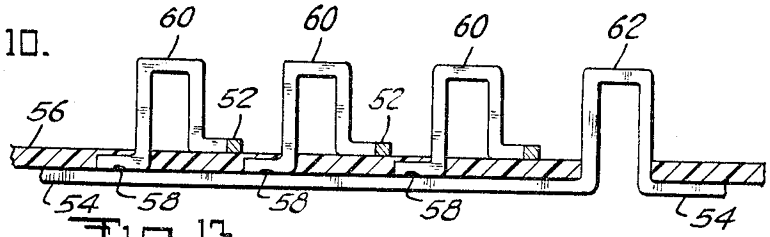
FIG. 10 is a cross-sectional view taken along line 10—10 of FIG. 9.

In FIGS. 9 and 10, a universal matrix which is electrically similar to FIG. 1, is shown. This embodiment differs in the manner of electrical connection used between the upper conductors 52 and the lower conductors 54. The upper and lower conductors, 52 and 54, respectively, are located on opposite sides of an insulating sheet 56, shown partly broken away. The transverse lower conductors 54 are weldably connected at 58 to the upper conductors 52 through a loop portion 60 integral with the upper conductors. A similar loop portion 62 is electrically in series with the lower conductors 54 to provide for severance thereof.

Figure 11:
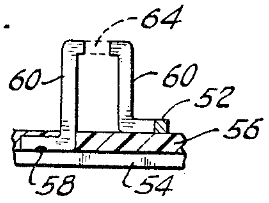
FIG. 11 is a partial section of a severed intersection loop of FIG. 10.
Figure 12:
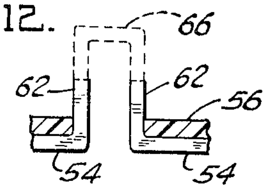
FIG. 12 is a cross-sectional view of a severed conductor of FIG. 10.

In FIG. 11, there is shown a severed upper loop portion, while FIG. 12 shows an alternate method of severing another loop from the lower portion. The dotted area 64 in the severed loop 60 can be removed by any of many well known methods, such as drilling, cutting or grinding. The removed portion 66 of the loop 62 can similarly be removed by a suitable process.

Figure 13:
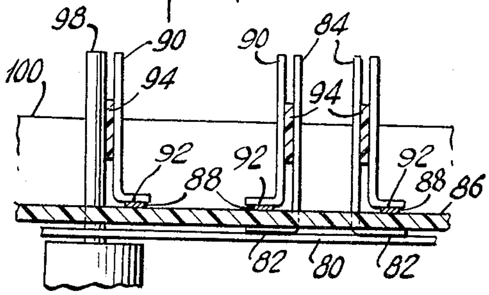
FIG. 13 is a side elevation view in partial section of another form of the invention.
Figure 14:
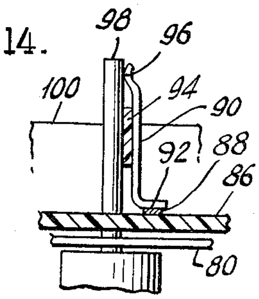
FIG. 14 shows a portion of FIG. 13 with a welded connection between conductors.
Figure 15:
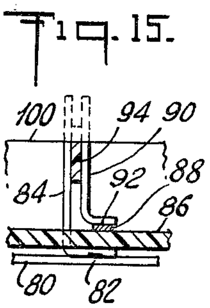
FIG. 15 shows a portion of FIG. 13 after severance of adjacent conductor tabs along the potting line.

FIGS. 13–15 illustrate another embodiment of the invention, wherein exposed conductor terminations are provided at each conductor intersection to thereby permit the optional connection or disconnection of each cross-over point in the circuit board pattern. Upstanding conductor tab extensions are welded to spaced lower conductors 80 at 82 and the extensions 84 pass through apertures in an insulating sheet 86. On the upper surface of the insulating sheet 86, spaced conductor elements 88, having upstanding connecting tab portions 90 are located. Each of the connecting tab portions 90 has an associated tab portion 84 in parallel proximity thereto. The tab portions 90 are suitably connected, such as by welding at 92 to the upper conductor 88. Separating each adjacent pair of upstanding tab extensions is an insulating spacer 94, which electrically isolates each conductor from its crossing conductor until the final determination of the desired connection is ascertained. FIG. 14 shows a weld 96, which has electrically joined a component lead 98 to the upstanding conductor tab portion 90. In FIG. 15, an illustrative view is shown wherein it is desired to maintain an open connection between the crossing conductors 80 and 88. In this view, the portions of tabs and the insulator 94, which extended beyond the potting line 100, have been removed. This removal can be accomplished by any suitable process, such as drilling, sawing, grinding, etching, etc. It should be noted that as shown in FIG. 13, the insulation 94 is purposely recessed below the ends of the adjacent conductive tabs, thereby providing sufficient tab length to optionally either weld or sever.

The embodiments shown and the further embodiments to be described are illustrated by means of a universal type "OR" gate circuit module. FIG. 16 and the following drawings show the embodiments utilizing this "OR" circuit, but it is to be understood that the principles shown therein are applicable to a great number of otherwise constructed and connected module units.

The "OR" circuit shown employs the principle of severing, rather than establishing connections, but it is to be understood that this was chosen for purposes of illustration only and that any of the embodiments illustrated could include a combination of the two techniques.

In FIG. 16, a universal "OR" module is shown completely assembled and encapsulated in a potting material forming a unit 102. The shape of the module is not restricted to rectangular form but for purposes of optimum utilization of available space, rectangular modular construction is generally preferred by instrument designers. Connections 104 can either be prongs, as shown in the preferred embodiment of FIG. 16, or insulated or uninsulated wires of any desired thickness and rigidity.

Figure 20:
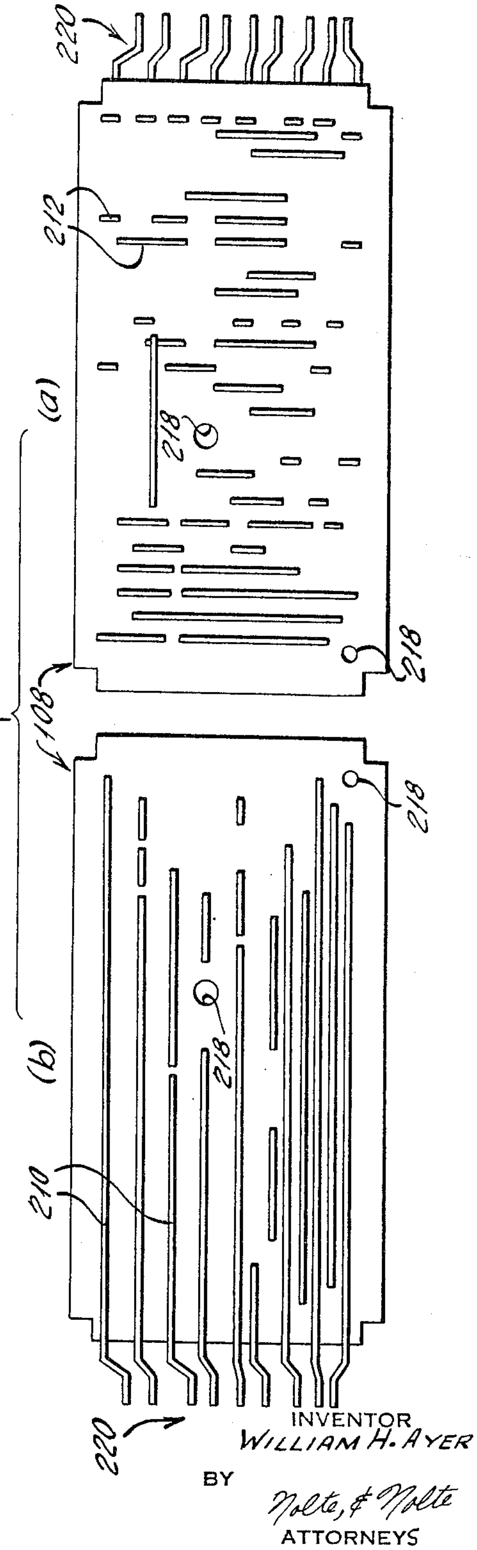
Figure 21:
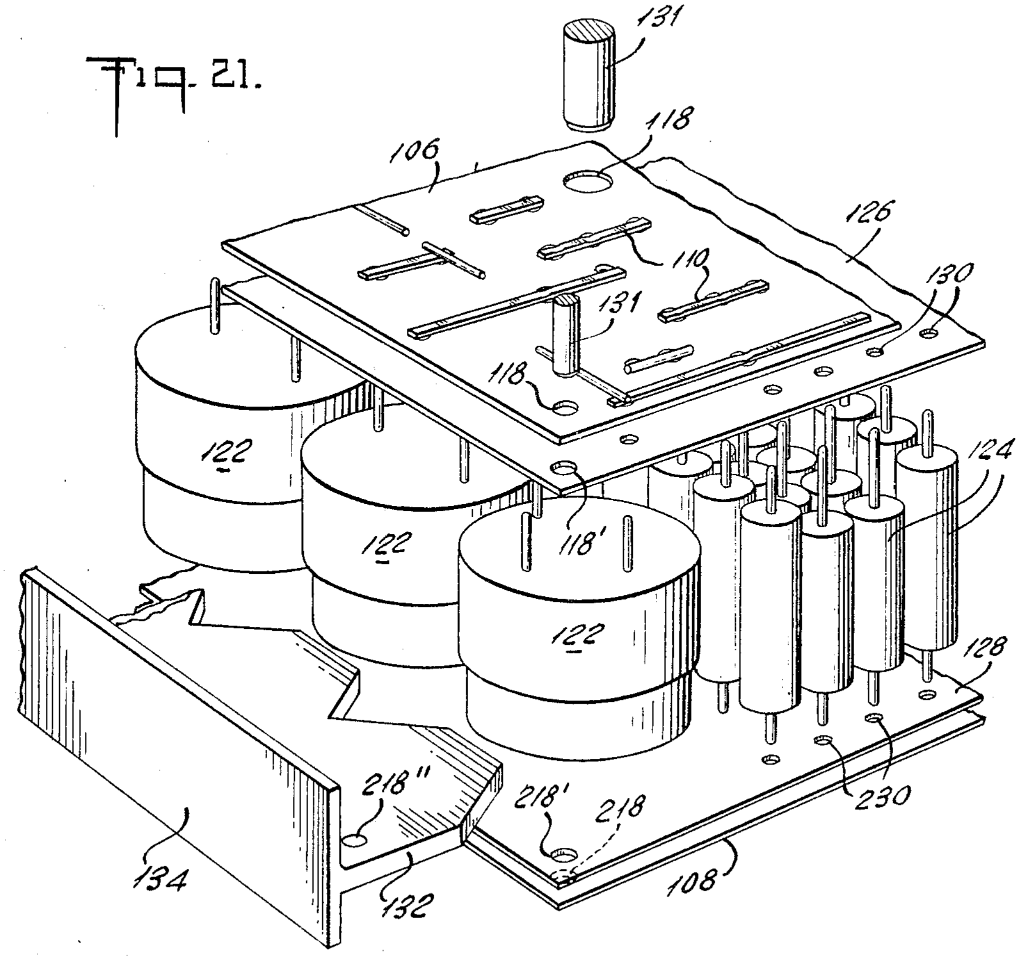
FIG. 21 is an exploded view of the particular type of module assembly shown in FIGS. 16 to 20.

FIG. 21 shows a partially broken away exploded view of the construction of the universal "OR" gate circuit of the embodiment, showing the general locations of a top circuit panel 106 and a bottom circuit panel 108, to be further described in connection with FIGS. 17–20. FIGS. 17 and 18 show boards 106 and 108 prior to wiring. The boards are made of an insulating material, such as Mylar. Lines 110 and 210 shown by darker shading, show preprinted locations where the leads will subsequently be on the bottom side of the boards 106 and 108. The printed double lines 112 and 212 indicate the locations for the transverse conductors on the top side of boards 106 and 108. Holes 114 and 214 are punched into the board at preselected locations for joining the lengthwise and crosswise running conductors 110, 210 and 112, 212 respectively in any desired configuration. Holes 116 and 216 along the longer margins of boards 106 and 108 have a subsidiary purpose for a particular method of applying the conductors to the board. The role of alignment holes 118 and 218 will be described later.

Figure 19:
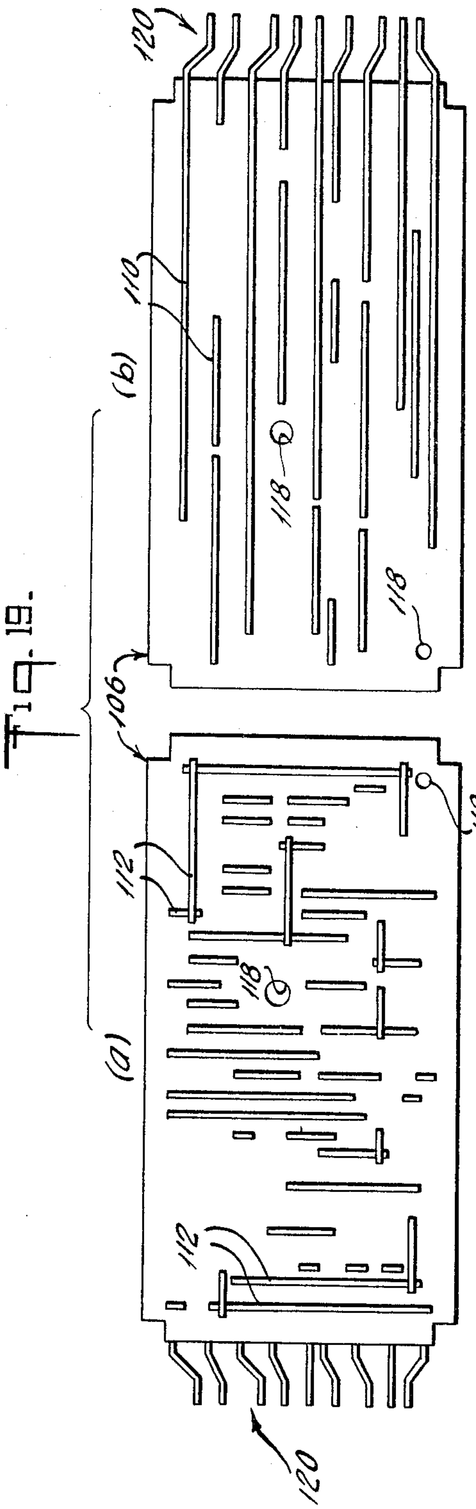
FIGS. 19 and 20 show the wired matrices of the module shown in FIGS. 16 to 18, viewing both matrices from their respective tops and bottoms.

The arrangement of the lengthwise and crosswise applied conductors on each side of boards 106 and 108 is shown in FIGS. 19 and 20. Subsidiary FIGURES 19*a* and 20*a* show the respective top sides of top board 106 and bottom board 108, while subsidiary FIGURES 19*b* and 20*b* show the respective bottom sides of top board 106 and bottom board 108. These figures show only the positions of the conductors. The actual appearance of the complete wired matrix can be visualized by proper super-position of the respective FIGURES 19*a* and 19*b*, 20*a* and 20*b*, thereby presenting a somewhat similar appearance to that of the printed layout therefor shown in FIGS. 17 and 18. Protruding leads 120 and 220 in the completed unit are connected to terminal prongs 104.

In FIG. 21, a partial exploded perspective view of the "OR" circuit module 102 is shown prior to encapsulation. Transistors 122 and other components 124, such as diodes, resistors, condensers, etc., are mounted between upper and lower boards 106 and 108, respectively, as guided by upper and lower jigging films 126 and 128. Selectively spaced guidance bores 130 and 230, respectively, are provided to guide the leads of the transistors 122 and components 124 to the preselected locations on boards 106 and 108, where they are electrically connected, preferably by welding, to predetermined portions of conductors 110, 112, 210, 212.

The holes 118′ and 218′ in jig plates 126 and 128 are in alignment with the corresponding holes 118 and 218 in boards 106 and 108. A pair of pins or dowels 131 are placed through holes 118, 118′, 218′ and 218 of the assembly to hold all parts thereof in alignment for the encapsulating operation. After encapsulation, the dowels 130 are removed to form a pair of alignment diameters from which accurate placement of a drill jig or template may be made so that holes drilled into the encapsulated module will properly sever the desired conductor.

Cooling member 132 is made of a good heat conductor, such as aluminum, to provide cooling for transistors 122 by conducting away the generated heat. The cooling member 132 is pressed against, or cemented to transistors 122 and is also potted into the assembly 102. A hole 218″ is provided for aligning dowel 130.

Figure 22:
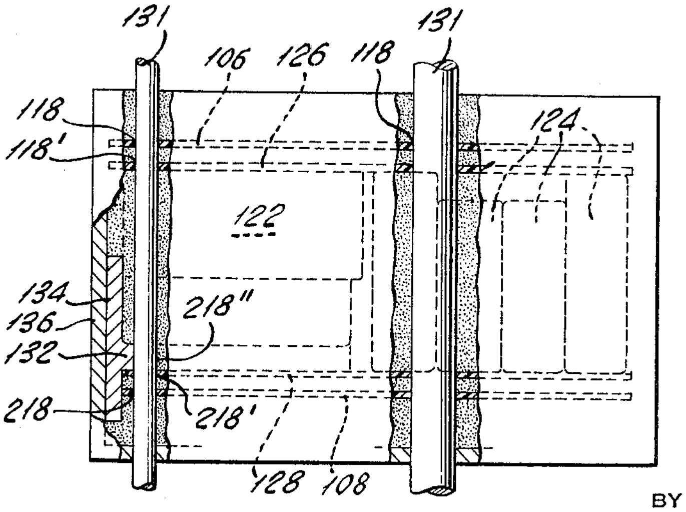
FIG. 22 is a sectional view of the assembled unit of FIGS. 16 to 21 showing the location of some significant components.

The potted assembly is also shown partially in section in FIG. 22, wherein aligning dowels 130 are shown in place. A flat, abutting portion 134 of cooling member 132 contacts an outer cooling member 136 over a relatively large area. The outer surface of outer cooling member 136 is not covered with the potting material but presents an exposed metallic surface on two exterior sides of the module 102. Depending upon the actual application, this outer surface may or may not be in contact with additional cooling means, such as a group of cooling fins or other radiators (not shown).

Figure 23:
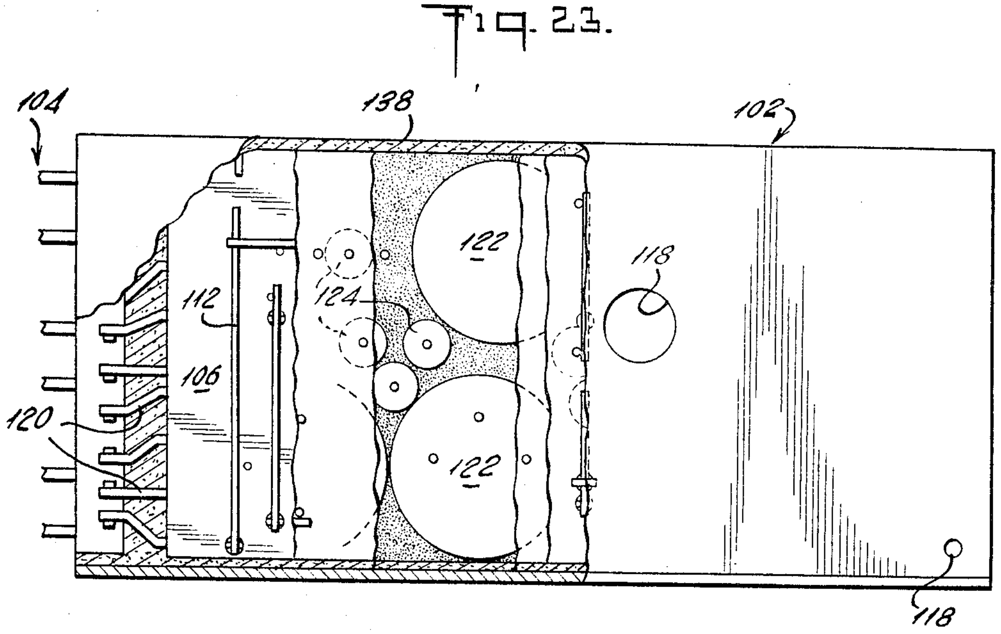
FIG. 23 is a partially broken away plan elevational view of the assembled unit of FIGS. 16 to 22.

In FIG. 23, a partially broken away plan view of the unit 102 is shown. The leads 120 are attached to outer leads 104. The aligning dowels 131 are shown removed module thereby forming the alignment holes 118. Since the potting material 138 fills all the interior voids of the assembly, the cylindrical holes 118 present insulated apertures through the module, the larger of which may conveniently accept a fastening bolt (not shown) extending therethrough.

Figure 24:
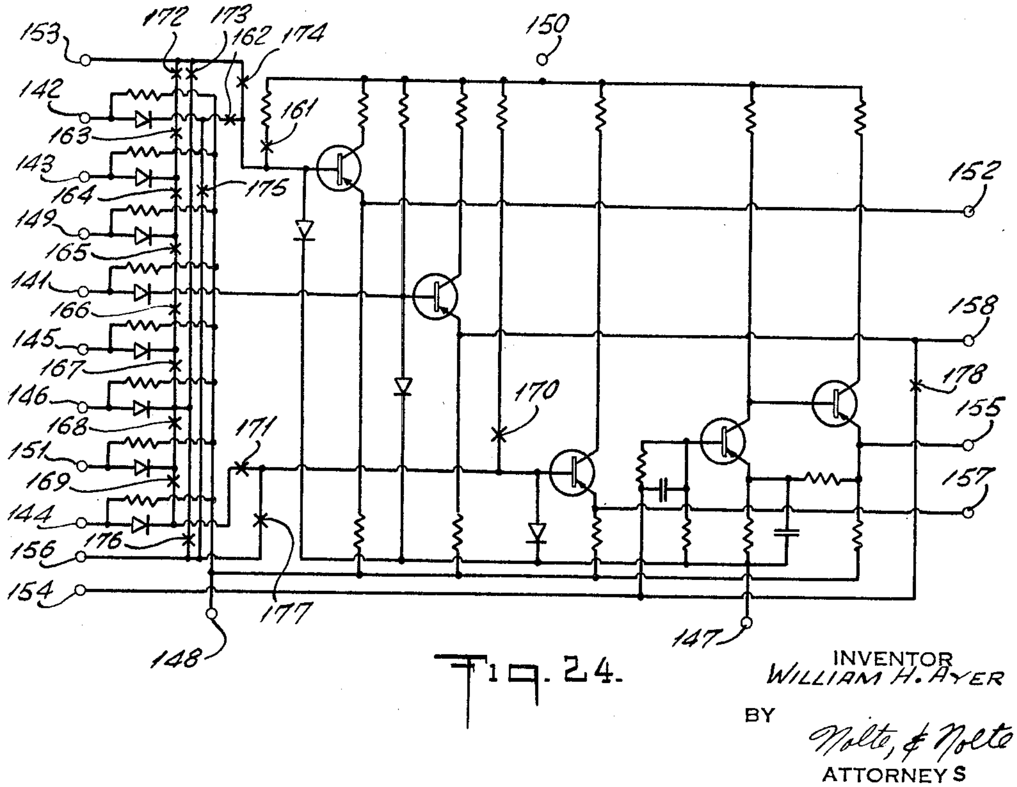
FIG. 24 shows the wiring diagram of the universal unit shown in FIGS. 16 to 23.

In FIG. 24, a complete wiring diagram of the above-described "OR" module 102 is shown. The terminals 120 and 220 (FIGS. 19 and 20) on the wiring boards are represented by terminals 141–158. The universal circuit as shown in FIG. 24 is of the type containing an excess number of connectors. It can be transformed into any one of a great number of operative subcircuits by severing the proper connections at points 161 to 178.

In the simplest form, such a severance can be accomplished by drilling inwardly from the sides adjacent the wiring boards through the potting material at preselected points to a predetermined depth. The location of these points can either be marked on the exterior surface of the potted unit 102, or by using a conventional drill template (not shown). Holes 118 on one side of the unit and holes 218 on the other side of the unit serve in their previously mentioned function to align such a template with the corresponding severance points of the unit. The template can either be of a universal type showing all the numbered severance points, or alternately, can be adapted to show the severance points to be severed in case of one specific subcircuit only. After the connections at the desired locations have been severed, the resulting hole can be easily filled with potting material. Alternately, it may suffice to have only one reference hole 118 and 218, respectively, and use the edge of the module 102 as the other reference.

Figure 25:
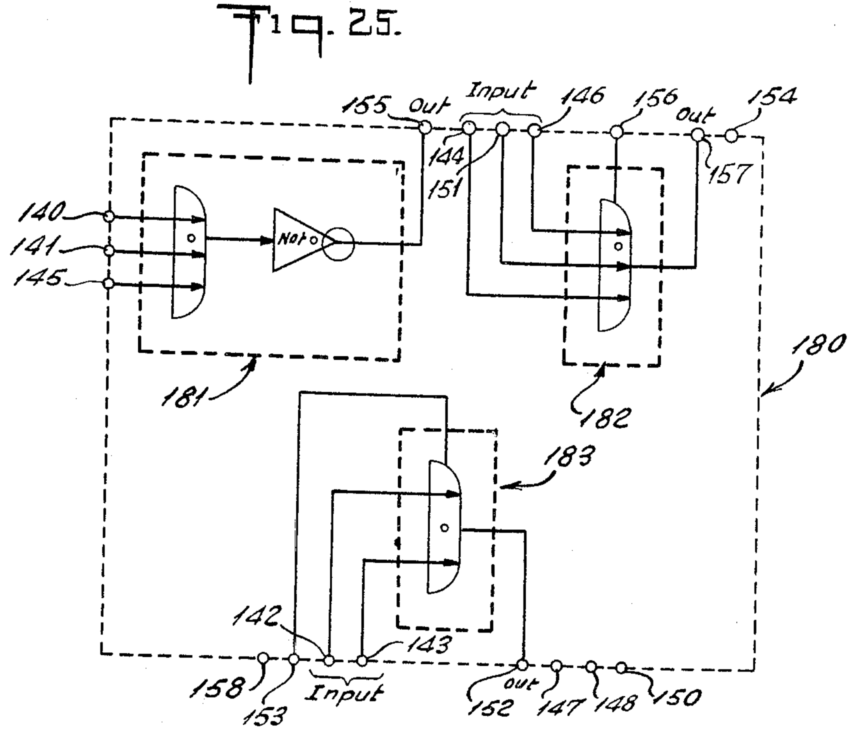
FIGS. 25 and 26 show two specific circuits obtained by modification of the wiring diagram shown in FIG. 24.
Figure 26:
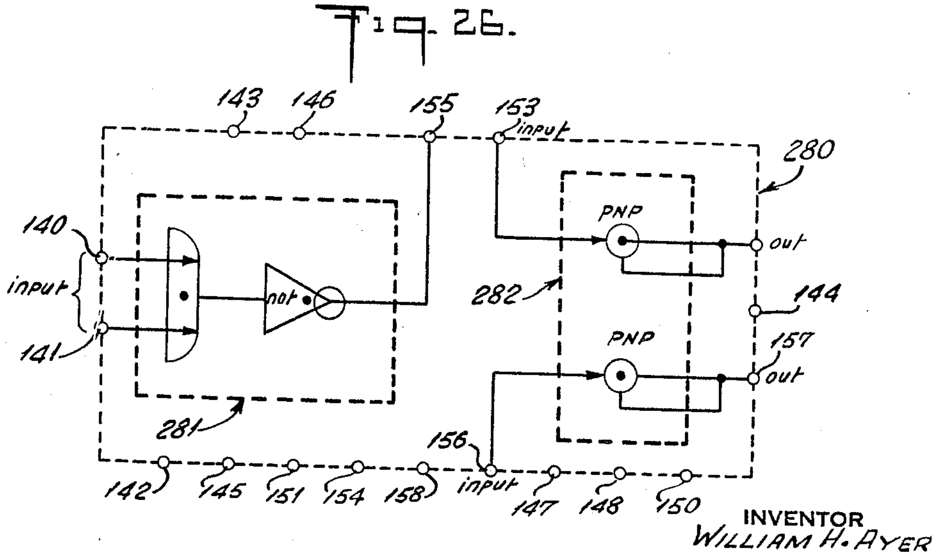

In FIGS. 25 and 26, two illustrative subcircuit embodiments to which the circuit of FIG. 24 may be altered are designated 180 and 280, respectively. Subcircuit 180 is obtained by severing selected transverse and longitudinal conductors 110, 112, 210, 212 as required corresponding to the designated points 164, 167, 173 and 175 of the circuit shown in FIG. 24. Subcircuit 180 consists of three separate secondary subcircuits: a three input "NOR" gate 181, a three input "OR" gate 182 and a two input "OR" gate 183.

Similarly, subcircuit 280 is obtained by severing selected conductors 110, 112, 210, 212 as required corresponding to the designated points 161, 162, 164, 166, 170–173, 175 and 176 of the circuit shown in FIG. 24. Subcircuit 280 consists of two separate secondary circuits: a two input "NOR" gate 281 and a PNP transistor emitter follower 282 having two separate stages.

As previously noted, each of the desired conductor severances may be made by drilling inwardly into the encapsulated module to a predetermined depth according to a template or other exterior locating means.

As noted from FIGS. 25 and 26, the novel objects and advantages of the invention are readily accomplished.

In this manner the invention has provided a novel means for altering a prefabricated and prewired electronic module of a very general nature into the desired specific module. This is accomplished by providing a novel circuit board wiring arrangement wherein either an excess or a deficiency of wiring connections have been made between criss-crossing conductors.

While the specific embodiment shown employs the preferred means of altering the circuit by severance, it will be readily understood that a universal module could also easily be converted into any number of specific modules based partially or entirely on establishing connections.

It should also be understood that the conductors interconnecting the module components need not necessarily be associated with an insulating sheet. For instance, conductors of sufficient rigidity, either insulated or uninsulated, could be employed to interconnect the module components prior to potting, as for instance as disclosed in U.S. Patent No. 2,911,572 without recourse to a prewired circuit panel such as employed in the embodiment of FIG. 16. Furthermore, these portions of the various conductors potentially requiring severance could be routed close to surface portions of the module in a loop according to FIG. 12 to facilitate severance.

While specific embodiments of the invention have been shown and described in detail, to illustrate the application of the principles of the invention, it will be understood that the invention may be embodied otherwise, without departing from such principles; therefore, the full scope of the invention is to be interpreted from the appended claims.

What is claimed is:

1. A universally adaptable wiring system for electrical apparatus, comprising an insulating sheet, a plurality of spaced conductors on one side of the insulating sheet, a second plurality of spaced conductors on the other side of the insulating sheet lying in a criss-cross relation to said opposite side conductors, and electrical connection means between opposite side conductors at each criss-cross junction, said electrical connection means including spaced extending tab portions on opposite side conductors passing through apertures in the insulating sheet, said tabs being welded together and positioned adjacent said criss-cross junctions whereby preselected severing may be made by removing the welded connection to form a predetermined wiring pattern.

2. A universally adaptable wiring system for electrical apparatus, comprising an insulating sheet, a plurality of spaced conductors on one side of the insulating sheet, a second plurality of spaced conductors on the other side of the insulating sheet lying in a criss-cross relation to said opposite side conductors, upstanding spaced conductor projections passing through apertures in the insulating sheet adjacent the criss-cross junctions, and clip connection means secured between selected conductor projections on one side of the board to similar conductor projections on the opposite side conductors.

3. A universally adaptable wiring system for electrical apparatus, comprising an insulating sheet, a plurality of spaced conductors on one side of the insulating sheet, a second plurality of spaced conductors on the other side of the insulating sheet lying in a criss-cross relation to the opposite side conductors, upstanding spaced conductor projections extending from the conductors on one side of the insulating sheet, upstanding spaced conductor projections from the conductors on the opposite side of the insulating sheet extending through the insulating sheet in juxtaposition to one of the first mentioned projections, insulation means between a portion of the juxtaposed conductor projections and an insulating compound on said sheet extending up to an intermediate level of said insulating means between said juxtaposed conductor projections whereby said conductor projections may be connected and disconnected near the level of the insulating compound to form a predetermined wiring pattern between criss-crossed conductors.

4. A universally adaptable electrical circuit module unit comprising a plurality of adjacent layers, each of said layers including a plurality of spaced electrical conductors, said conductors of said adjacent layers having intersection points, the conductors of said adjacent layers being connected at preselected ones of said intersection points, electrical component means disposed between pairs of said layers and connected to selected ones of said intersection points, said intersection points being selectively severed to disconnect electric components to form a predetermined electrical circuit, an insulating sheet between pairs of said plurality of layers alternate with said electrical component means for providing electrical insulation between said conductors of said layers, selectively spaced holes in said sheet for connecting said conductors of said layers at the selected intersection points, protective enclosure means for protection of the module unit against ambient conditions, and reference means in said enclosure means for determination of the exact position of selected connections to be altered within the protected module unit.

5. A universally adaptable electrical circuit module unit according to claim 4, wherein said sheet is of Mylar having preprinting thereon of the location of the conductors of the corresponding layers, and said protective means comprises a potting material for hermetically sealing said layers of conductors and said electrical component means.

6. A universally adaptable electrical circuit module unit according to claim 4, wherein said electrical component means includes electron control means.

7. A universally adaptable electrical circuit module unit according to claim 4, wherein said conductors of said adjacent layers form a criss-cross pattern.

8. A universally adaptable electrical circuit module unit according to claim 4, wherein said electrical component means includes solid state electron control means and said protective means includes cooling means in contact with said solid state means.

References Cited by the Examiner

UNITED STATES PATENTS

| | | | |
|---|---|---|---|
| 2,019,625 | 11/1935 | O'Brien | 317—101 |
| 2,857,558 | 10/1958 | Fiske | 317—101 |
| 2,883,447 | 4/1959 | Dahl | 317—101 |
| 2,911,572 | 11/1959 | Francis et al. | 29—155.5 |
| 2,963,626 | 12/1960 | Du Val et al. | 317—101 |
| 3,098,951 | 7/1963 | Ayer et al. | 317—101 |
| 3,151,277 | 9/1964 | Gray | 174—68.5 |

OTHER REFERENCES

Welded Circuitry for Miniaturization (D. A. Sayles) Packaged Electronics Division Amphenol-Borg Electronics Corp., June 1961.

ROBERT K. SCHAEFER, *Primary Examiner.*

ROBERT S. MACON, JOHN F. BURNS, LARAMIE E. ASKIN, KATHLEEN H. CLAFFY, *Examiners.*

J. G. COBB, *Assistant Examiner.*